(12) United States Patent
Suzuki

(10) Patent No.: US 9,306,541 B2
(45) Date of Patent: Apr. 5, 2016

(54) SEMICONDUCTOR INTEGRATED CIRCUIT

(75) Inventor: Yasuyuki Suzuki, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 14/110,330

(22) PCT Filed: Mar. 21, 2012

(86) PCT No.: PCT/JP2012/058044
§ 371 (c)(1),
(2), (4) Date: Oct. 7, 2013

(87) PCT Pub. No.: WO2012/141008
PCT Pub. Date: Oct. 18, 2012

(65) Prior Publication Data
US 2014/0028400 A1 Jan. 30, 2014

(30) Foreign Application Priority Data
Apr. 11, 2011 (JP) .................................. 2011-087418

(51) Int. Cl.
*H03K 17/16* (2006.01)
*H03H 11/28* (2006.01)
(Continued)

(52) U.S. Cl.
CPC ................. *H03H 11/28* (2013.01); *H03F 1/38* (2013.01); *H03F 3/45085* (2013.01);
(Continued)

(58) Field of Classification Search
CPC ..................... H01L 23/5222; H01L 31/02019; H03F 1/56; H03F 3/08; H03F 3/19; H03K 3/2885; H03K 3/289
See application file for complete search history.

(56) References Cited

U.S. PATENT DOCUMENTS 5,214,318 A * 5/1993 Nakanishi .............. H03K 5/151
326/124
5,510,734 A * 4/1996 Sone .................... H03K 3/2885
327/203

(Continued)

FOREIGN PATENT DOCUMENTS

JP S59-216306 A 12/1984
JP H6-268496 A 9/1994
(Continued)

OTHER PUBLICATIONS

International Search Report for PCT Application No. PCT/JP2012/058044, mailed on May 29, 2012.
(Continued)

*Primary Examiner* — Jason M Crawford
*Assistant Examiner* — Kurtis R Bahr

(57) ABSTRACT

In an integrated circuit having a feedback amplifier circuit composed of the feedback which feedbacks a part of the output signal to the input side in the first stage, a semiconductor integrated circuit of the present invention can suppress the occurrence of the data signal distortion and the gain peaking of the frequency characteristic generated by inter-stage wiring between the first stage and the latter stage.
A semiconductor integrated circuit of the present invention includes the first circuit and the second circuit having the first output connected to the first circuit, and the second output that is a signal similar to said first output is outputted from between said first circuit and said second circuit. In addition, a semiconductor integrated circuits of the present invention has the feature that the output impedance pulled out from between said first circuit and said second circuit, the input impedance of the circuit connected to the latter stage of said second circuit and the characteristic impedance of the wiring which connects said second output with a circuit connected to the latter stage of said second circuit are equal to each other.

5 Claims, 18 Drawing Sheets

(51) Int. Cl.
  *H03F 3/45* (2006.01)
  *H03F 1/38* (2006.01)
  *H03K 3/2885* (2006.01)
  *H03K 3/289* (2006.01)

(52) U.S. Cl.
  CPC . *H03F 3/45475* (2013.01); *H03F 2203/45138* (2013.01); *H03F 2203/45652* (2013.01); *H03K 3/289* (2013.01); *H03K 3/2885* (2013.01)

(56) References Cited

U.S. PATENT DOCUMENTS

| | | | | |
|---|---|---|---|---|
| 5,892,382 | A * | 4/1999 | Ueda | H03K 3/35613 327/199 |
| 6,218,878 | B1 * | 4/2001 | Ueno | H03K 3/289 327/202 |
| 6,486,720 | B2 * | 11/2002 | Reimann | H03K 3/2885 327/200 |
| 6,781,404 | B2 * | 8/2004 | Suzuki | H01L 23/5222 326/30 |
| 7,106,093 | B2 * | 9/2006 | Suzuki | H03F 1/56 326/115 |
| 7,126,419 | B2 * | 10/2006 | Miyasita | H03F 3/45085 330/69 |
| 7,759,992 | B2 * | 7/2010 | Ibuka | H03L 7/095 326/115 |
| 8,222,590 | B2 * | 7/2012 | Suzuki | H03F 3/08 250/214 A |
| 8,483,581 | B2 * | 7/2013 | Suzuki | H01L 31/02019 398/209 |
| 2005/0231258 | A1 * | 10/2005 | Suzuki | H03K 3/289 327/218 |
| 2010/0225355 | A1 * | 9/2010 | Hairapetian | H03K 3/356043 326/115 |

FOREIGN PATENT DOCUMENTS

| | | |
|---|---|---|
| JP | 2002-270773 A | 9/2002 |
| JP | 2003-51723 A | 2/2003 |
| JP | 2003-264437 A | 9/2003 |
| JP | 2004-153237 A | 5/2004 |

OTHER PUBLICATIONS

Yasuyuki Suzuki et al., "An 80-Gb/s 2.7-Vp-p Driver IC Based on Functional Distributed Circuits for Optical Transmission Systems." 2005 IEEE Radio Frequency integrated Circuits (RFIC) Symposium. p. 325-328., 2005 IEEE.

Japanese Office Action for JP Application No. 2013-509845 mailed on Aug. 25, 2015 with English Translation.

* cited by examiner

US 9,306,541 B2

SEMICONDUCTOR INTEGRATED CIRCUIT

This application is a National Stage Entry of PCT/JP2012/058044 filed Mar. 21, 2012, which claims priority from Japanese Patent Application 2011-087418 filed Apr. 11, 2011, the contents of all of which are incorporated herein by reference, in their entirety.

TECHNICAL FIELD

The present invention relates to a feedback amplifier circuit and relates to a high-speed semiconductor integrated circuit which processes a wide bandwidth data signal in particular.

BACKGROUND ART

In recent years, as signal processing for higher level information is required, an integrated circuit is requested which enables to process the higher speed signals. Reduction in wiring length and improvement of the degree of the circuit integration have been achieved so as to reduce the wiring delay time as well as the superior transistor performance so as to make the operation speed of the integrated circuit higher.

Device performance improvement is basically obtained by the device size reduction. Improvement of the current gain cut-off frequency is obtained by reduction in the gate length in a field effect transistor. The superior performance of a transistor is achieved by reduction in the base thickness and the emitter width in a bipolar transistor, and reduction in the parasitic capacity caused by reducing periphery.

When the transistor is refined and improved in performance, the parasitic capacity of wiring in the chip will be a problem. Accordingly, in order to reduce the wiring delay time between the transistors, the wiring length is reduced and the large scale integration is achieved so that the speed of the integrated circuit may be increased.

However, it is impossible to reduce the length of all wires on the circuit layout. When the data signal rate of the data will be high frequency of several GHz the influence of the wiring length cannot also be ignored any more in reduced wiring. In order to reduce the delay time, low parasitic capacity air bridge wiring is used. However, the distortion is generated in a data signal due to an inductor component of wiring even if in the circuit.

As one kind of logic circuits, there is a flip-flop circuit able to express 1 bit information by the value of "0" and "1", and hold the information. A flip-flop circuit is composed of a pair of switching elements basically. The information outputted from a flip-flop circuit is fed back to a flip-flop circuit itself, and is held as far as it is in the powered state.

FIG. 19 is an exemplary configuration of a flip-flop circuit 1 using an ECL basic circuit.

In FIG. 19, a master circuit 2 has a data reading circuit composed of resistance elements R1, R2, and transistors Q1, Q2, and Q18, and a data holding positive feedback circuit composed of resistance elements R1, R2, transistors Q3, Q4, Q9, transistors Q14, Q15, and resistance elements R5, R6. The master circuit 2 further has a current source circuit composed of a transistor Q12 connected to a common emitter of transistors Q18 and Q9.

A slave circuit 3 has a data reading circuit composed of resistance elements R3, R4, and transistors Q5, Q6, Q10, and a data holding positive feedback circuit composed of resistance elements R3, R4, transistors Q7, Q8, Q11, transistors Q16, Q17, and resistance elements R7, R8. The slave circuit 3 further has a current source circuit composed of a transistor Q16 connected to a common emitter of transistors Q10 and Q11.

GND is a ground terminal and VEE is a power supply terminal. Further, each of transistors Q14, Q15, resistance element R5 and R6, transistors Q16, Q17 and resistance elements R7, R8 composes emitter follower circuits. When an integrated circuit is formed with making the flip-flop circuit as the first stage circuit, the output of the flip-flop circuit 1 is composed of an emitter follower circuit. The emitter follower circuit composes a voltage level shift circuit of the data holding positive feedback circuit.

Due to the characteristic of the emitter follower circuit, even if the resistance values of the resistance elements R7 and R8 have been adjusted, the resistance elements R7 and R8 in the emitter follower circuit cannot perform as an output terminating resistance, and cannot obtain the impedance matching with the latter stage. In other words, it is difficult to form an output terminating resistance in the output of this emitter follower circuit, unlike in the case of a current switch differential circuit of FIG. 16 and FIG. 17 mentioned later, and a 2-to-1 selector core circuit of FIG. 18. Accordingly, it is difficult to get wide bandwidth impedance matching which covers up to tens of GHz with the latter stage in the circuit as it is.

As an optical receiving circuit, there is a transimpedance amplifier used to convert a low level electric current generated by a photodiode into a practical voltage signal.

A circuit exemplary configuration of the differential type transimpedance amplifier is shown in FIG. 20.

The differential type transimpedance amplifier of FIG. 20 has a differential amplifier circuit composed of transistors Q22 and Q23, load resistances R15 and R16 and a transistor Q24 for a constant current source. Moreover, the differential type transimpedance amplifier has an emitter follower circuit composed of transistors Q25 and Q26, and load resistances R19 and R20 connected to an output terminal of differential amplifier circuit. Moreover, the differential type transimpedance amplifier has feedback resisters R17 and R18 connected between the output terminal of the emitter follower circuit and the input terminal of the differential amplifier circuit mentioned above. GND represents a ground terminal and Vcc represents a power supply terminal.

When an integrated circuit is formed with making the transimpedance amplifier as the first stage circuit, the output of the transimpedance amplifier is composed of an emitter follower circuit.

Due to the characteristic of the emitter follower circuit, even if the resistance values of the resistance elements R19 and R20 have been adjusted, the resistance elements R19 and R20 in the emitter follower circuit cannot perform as an output terminating resistance, and cannot obtain the impedance matching with the latter stage. In other words, it is difficult to form an output terminating resistance in the output of this emitter follower circuit, unlike in the case of a current switch differential circuit of FIG. 16 and FIG. 17 mentioned later, and a 2-to-1 selector core circuit of FIG. 18. Accordingly, it is difficult to get wide bandwidth impedance matching by a circuit with no change.

A semiconductor integrated circuit having current switch differential circuits as shown in FIG. 16 and FIG. 17, and an emitter follower circuits to which the output of the current switch differential circuits input is disclosed in the patent document 1 as a related art. In FIG. 16 and FIG. 17, an output terminal of current switch differential circuit 13 and an input terminal of an emitter follower circuit are connected via wiring 5 and 6. The circuit is composed so that the characteristic impedance of the wiring 5 and 6 may be matched with the output impedance of the current switch differential circuit 13 or the input impedance of the emitter follower circuit 14 in the predetermined frequency range respectively. The patent document 1 discloses that it is possible to suppress the distortion occurrence of the data signal and the gain peaking of the frequency characteristic by the technology of the patent document 1.

Further, in the patent document 2, a technology is disclosed with which a transmission line on the mounting board performs the impedance matching with the input and the output of an IC chip and the output drive current of an IC chip can be reduced so that the signal reflection and loss do not occur to even if the operation speed becomes high. Thus, it is enabled to provide a semiconductor apparatus with high speed and the low power consumption by the technology described in the patent document 2.

A driver IC in which a 2-to-1 selector and a differential distribution type amplifier are integrated as shown in FIG. 18 is disclosed in a non-patent document 1. A wide bandwidth impedance matching is performed between the 2-to-1 selector core circuit 15 and the differential distribution type amplifier 11. Load resistances R1 and R2 of the 2-to-1 selector core circuit 15 are used as an output terminating resistance of the first stage circuit, and the input matching resistances R21 and R22 of the differential distribution type amplifier are used as an input terminating resistance of the latter stage circuit. The characteristic impedance of the wiring 5 and 6 between the 2-to-1 selector core circuit 15 and the differential distribution type amplifier 11 has been matched with the input impedance of the differential distribution type amplifier of the latter stage circuit. As a result, the input impedance of the differential distribution type amplifier of the latter stage connected by wiring becomes flat from DC (Direct Current) to 80 GHz, and the distortion occurrence of the data signal in wiring has been suppressed.

THE PRECEDING TECHNICAL LITERATURE

Patent Document

[Patent document 1] Japanese Published Patent Application No. 2002-270773
[Patent document 2] Japanese Published Patent Application No. 2004-153237

Non-Patent Literature

[Non-patent literature 1] Radio Frequency integrated Circuits (RFIC) Symposium and 2005. Digest of Papers. 2005 IEEE Pages: 325-328

SUMMARY OF INVENTION

Technical Problem

The technology disclosed in the patent document 1 is the technology with which the impedance matching is obtained between the current switch differential circuit and the emitter follower circuit which is its output stage. Accordingly, it is not the technology for obtaining the impedance matching between the flip-flop circuit having an emitter follower circuit as a feedback circuit, nor for obtaining the impedance matching between the output of a transimpedance amplifier and the latter stage circuit.

The technology disclosed in the patent document 2 is what relates to a semiconductor apparatus including a plurality of semiconductor integrated circuits such as MCM (Multi Chip Module), and not the technology applied inside the single semiconductor integrated circuit.

Object of Invention

An object of the present invention is to provide the following semiconductor integrated circuit in order to settle the above-mentioned problem. That is, an object of the present invention is to provide a semiconductor integrated circuit in which the feedback amplifier of the first stage circuit and the latter stage circuit can be directly connected and the wide bandwidth impedance matching can be performed between the stages of the first stage circuit and the latter stage circuit. The further object of the present invention is to provide a semiconductor integrated circuit capable of amplification or transmission of a data signal without generating the distortion and the gain peaking of the frequency characteristic.

Solution to Problem

A semiconductor integrated circuit of the present invention is characterized by that the semiconductor integrated circuit comprising a first circuit, a second circuit having a first output connected to the first circuit, wherein a second output that is a signal similar to the first output is outputted from between the first circuit and the second circuit, and an output impedance of a output drawn out from between the first circuit and the second circuit, an input impedance of a circuit connected to a latter stage of the second circuit and a characteristic impedance of a wiring that connects the second output and the circuit connected to the latter stage of the second circuit are equal to each other.

An impedance matching method of a semiconductor integrated circuit of the present invention is characterized by that the impedance matching method of a semiconductor integrated circuit, wherein the impedance matching method is applied to a semiconductor integrated circuit including a first circuit and a second circuits having a first output connected to the first circuit, a second output that is a signal similar to the first output is outputted from between the first circuit and the second circuit, and an impedance of a output drawn out from between the first circuit and the second circuit, an input impedance of a circuit connected to a latter stage of the second circuit, a characteristic impedance of a wiring which connects the second output and a circuit connected to the latter stage of the second circuit are equal to each other.

Advantageous Effects of Invention

As described above, the effect indicated on below is brought about in the present invention according to the constitution mentioned above. That is, a feedback amplifier circuit of the first stage circuit and the latter stage circuit can be connected directly, and the wide bandwidth impedance matching can be obtained between the stages of the first stage circuit and the latter stage circuit. Accordingly, the effect is obtained that a semiconductor integrated circuit capable of amplification or transmission of a data signal can be provided without generating the gain peaking of the distortion and the frequency characteristic.

DESCRIPTION OF EXEMPLARY EMBODIMENT

The present invention is not limited to following each exemplary embodiment, and various modifications can be performed at the range that does not deviate from a main point of the present invention.

First Exemplary Embodiment

Figure 1:
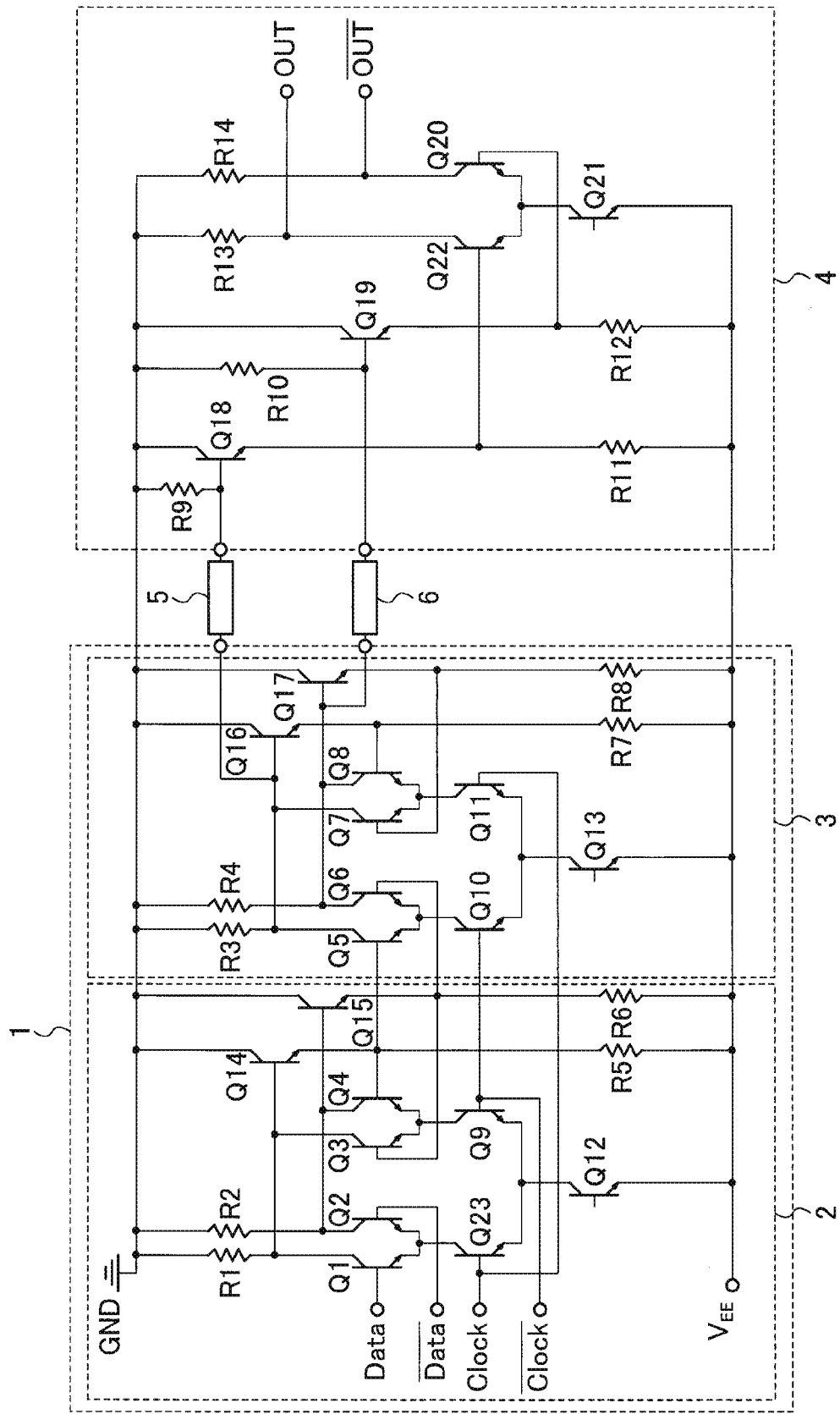
FIG. 1 is a circuit diagram (1) which shows a semiconductor integrated circuit of the first exemplary embodiment.

FIG. 1 is a figure which shows the first exemplary embodiment of a semiconductor integrated circuit of the present invention. FIG. 1 indicates an exemplary configuration in which the first stage circuit is a flip-flop circuit and the differential amplifier circuit is composed of the differential pair at the latter stage of the flip-flop circuit.

The flip-flop circuit 1 of FIG. 1 indicates a circuit configuration by a bipolar transistor.

The master circuit 2 has a data reading circuit composed of resistance elements R1 and R2, a transistor Q1, Q2 and Q23. Moreover, the master circuit 2 has a data holding circuit composed of resistance elements R1 and R2, transistors Q3, Q4 and Q9, a data holding positive feedback circuit composed of an emitter follower circuit of transistors Q14 and Q15 and resistance elements R5 and R6. Moreover, the master circuit 2 has a current source circuit composed of the transistor Q12 connected to a common emitter of transistors Q23 and Q9.

A slave circuit 3 has a data reading circuit composed of resistance elements R3 and R4 and transistors Q5, Q6 and Q10. Moreover, the slave circuit 3 has a data holding circuit composed of resistance elements R3 and R4, transistors Q7, Q8 and Q11 and a data holding positive feedback circuit composed of transistors Q16 and Q17, an emitter follower circuit of resistance elements R7 and R8. The slave circuit 3 further has a current source circuit composed of transistor Q13 connected to a common emitter of transistors Q10 and Q11. GND represents a power supply terminal and VEE represents a ground terminal.

A differential amplifier circuit 4 in the latter stage has input resistances R9 and R10 which is input terminating resistances of the latter stage, input transistors Q18 and Q19 of an emitter follower circuit, load resistances R11 and R12 of an emitter follower circuit and driving transistors Q22 and Q20 of a differential circuit as shown in FIG. 1. Further, the differential amplifier circuit 4 of the latter stage has load resistances R13 and R14 of a differential circuit and a constant current source transistor Q21 of a differential circuit.

An output of the slave circuit 3 of the flip-flop circuit 1 is drawn out from between the differential pair of the data reading circuit and the emitter follower circuit input of the data holding positive feedback circuit, outputted and inputted to the emitter follower circuit of differential amplifier circuit.

Here, an example of the impedance matching between the flip-flop circuit 1 and the differential amplifier circuit 4 will be described. The differential pair load resistances R3 and R4 of the slave circuit 3 of the flip-flop circuit 1 perform as an output terminating resistance of the first stage circuit, and the input resistances R9 and R10 of the emitter follower circuit of the differential amplifier circuit 4 performs as an input terminating resistance of the latter stage circuit.

Figure 2:
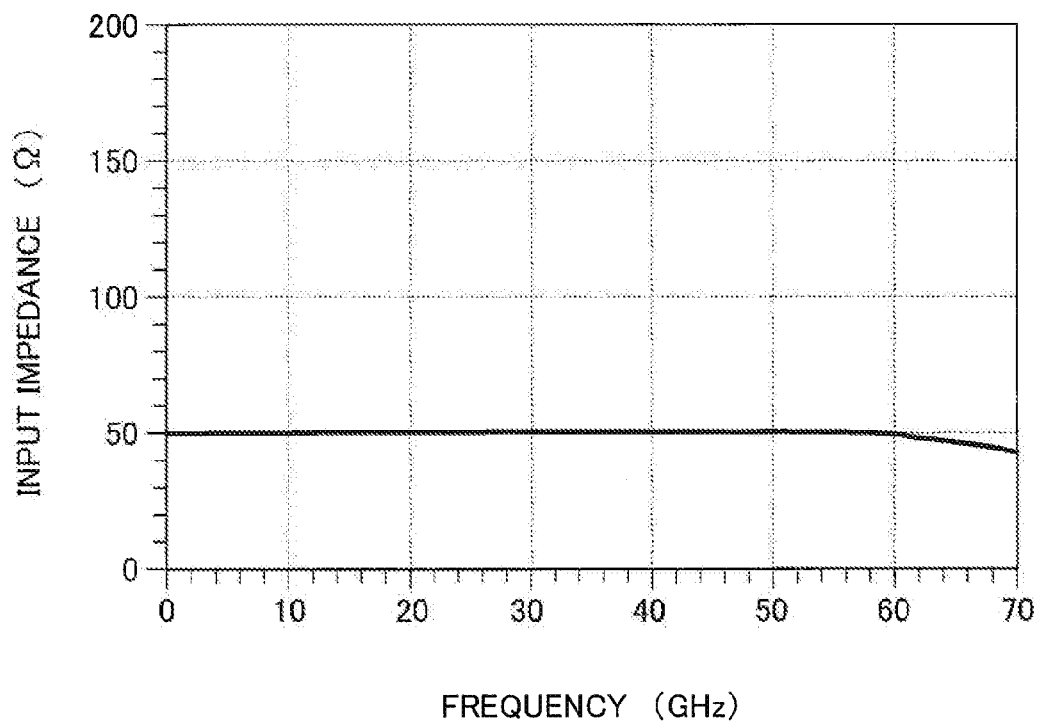
FIG. 2 is a characteristic diagram (1) of the exemplary embodiment of a semiconductor integrated circuit of the first exemplary embodiment.

The input impedance observed from an input terminal of the differential amplifier circuit 4 is shown in FIG. 2. As an example, FIG. 2 indicates the input impedance of the differential amplifier circuit 4 when using 50Ω resistance as the input resistances R9 and R10 of the emitter follower circuit of the differential amplifier circuit 4. According to FIG. 2, the input impedance of the differential amplifier circuit 4 is approximately 50Ω from DC to 70 GHz.

Figure 3:
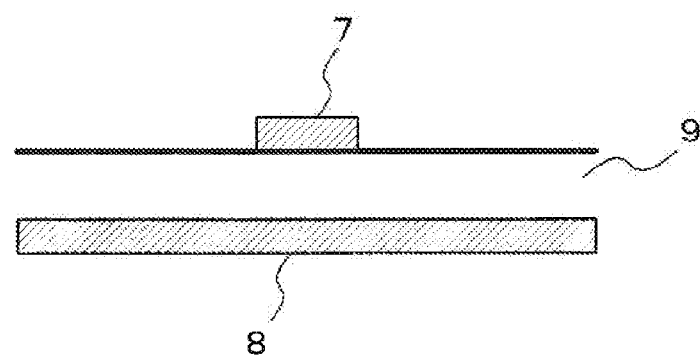
FIG. 3 is a tectonic profile of wiring used for a semiconductor integrated circuit of the first exemplary embodiment.

Wiring 5 and 6 between the flip-flop circuit 1 and the differential amplifier circuit 4 are formed and connected using the second wiring layer 7 with 1 μm thickness and 5 μm width via an interlayer insulating film 9 of SiO$_2$ with 3 μm thickness on the first wiring layer as a ground conductor 8, as shown in FIG. 3, for example. This wiring is microstrip line wiring, and its characteristic impedance will be about 50Ω. Although an example of wiring 5 and 6 has been described for description, wiring 5 and 6 are not limited to this configuration.

Figure 4:
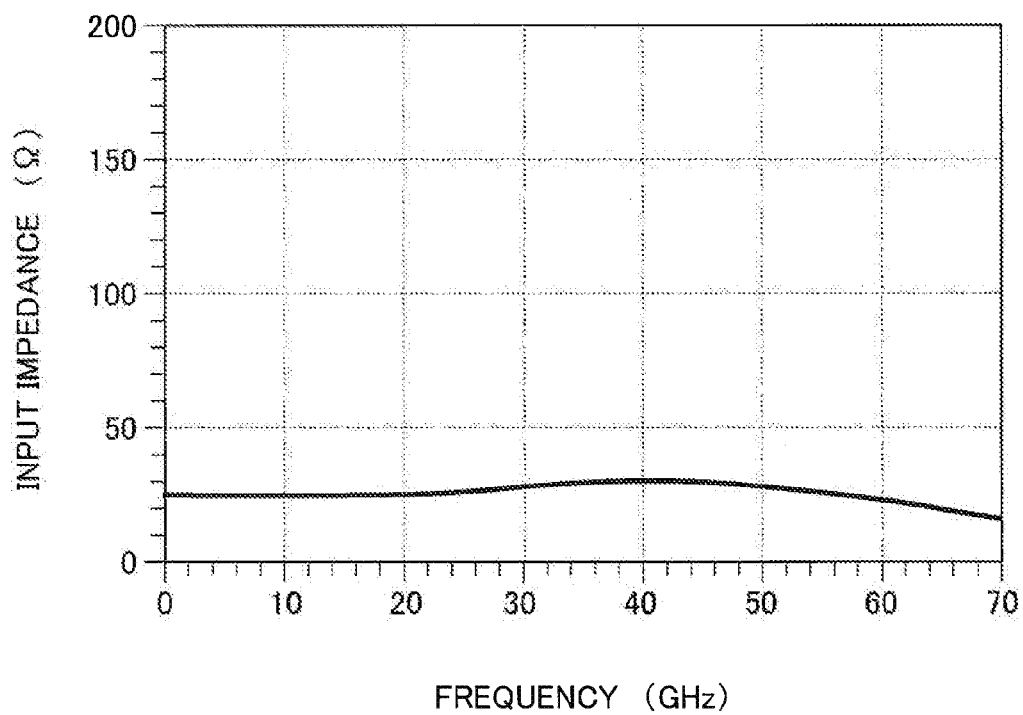
FIG. 4 is a characteristic diagram (2) of the exemplary embodiment of a semiconductor integrated circuit of the first exemplary embodiment.

According to the reason mentioned above, the input impedance of the differential amplifier circuit 4 and the characteristic impedance of the wiring 5 and 6 are matched. FIG. 4 indicates the frequency characteristic of the input impedance of the differential amplifier circuit 4 observed from an input edge of the differential pair load resistance R3 and R4 of the slave circuit 3 of the flip-flop circuit 1. As an example, 50Ω resistance is used for the differential pair load resistance R3 and R4 of the slave circuit.

As found by FIG. 4, the input impedance of the differential amplifier circuit 4 is flat in approximately 25Ω from DC to 70 GHz after connecting wiring 5 and 6. The value of 25Ω is the value obtained by the assumption that 50Ω of the differential pair load resistance R3 and R4 and 50Ω of the input resistances R9 and R10 of the emitter follower circuit of the differential amplifier circuit 4 are connected in parallel.

Because the input impedance of the differential amplifier circuit 4 is wide bandwidth and the input impedance observed from the input terminal of differential amplifier circuit 4 is wide bandwidth, the gain peaking does not occur in the frequency characteristic. Therefore, the data signal can be correctly amplified and transmitted without generating the distortion in the data signal.

A signal is outputted to the latter stage circuit from between the differential pair of the data reading circuit of the flip-flop circuit and the emitter follower circuit input of the data holding positive feedback circuit in this exemplary embodiment as shown in the above.

The output impedance of the slave circuit 3 of the flip-flop circuit 1 operating as an output terminating resistance of the first stage circuit is mostly flat over the bandwidth which the signal covers. Accordingly, the wide bandwidth impedance matching can be formed between the input impedance of the latter stage circuit and the characteristic impedance of the wiring between the stages.

Incidentally, it is supposed that an output position to the latter stage is between the differential pair of the data reading circuit of the flip-flop circuit and the emitter follower circuit input of the data holding positive feedback circuit in this exemplary embodiment. However, when the position satisfies the condition mentioned later, the output may be taken out of other positions of the circuit.

i) The output impedance is same as the input impedance of the latter stage and the characteristic impedance of the wiring between the latter stage input.

ii) The output impedance is constant over the bandwidth which the signal covers.

iii) An equivalent signal (similar signal) to the signal which tries to be transmitted to the next stage can be drawn out.

A bipolar transistor usage case has been described in the exemplary embodiment. However, it can also be similarly applied to the composition of an integrated circuit using other devices such as a field effect transistor (FET) of GaAs (gallium arsenide) and MOS (Metal Oxide Semiconductor). Although a master circuit has been described for the description of this exemplary embodiment, the master circuit is not required necessarily. The various design changes are possible about the composition of the master circuit.

The Second Exemplary Embodiment

Figure 5:
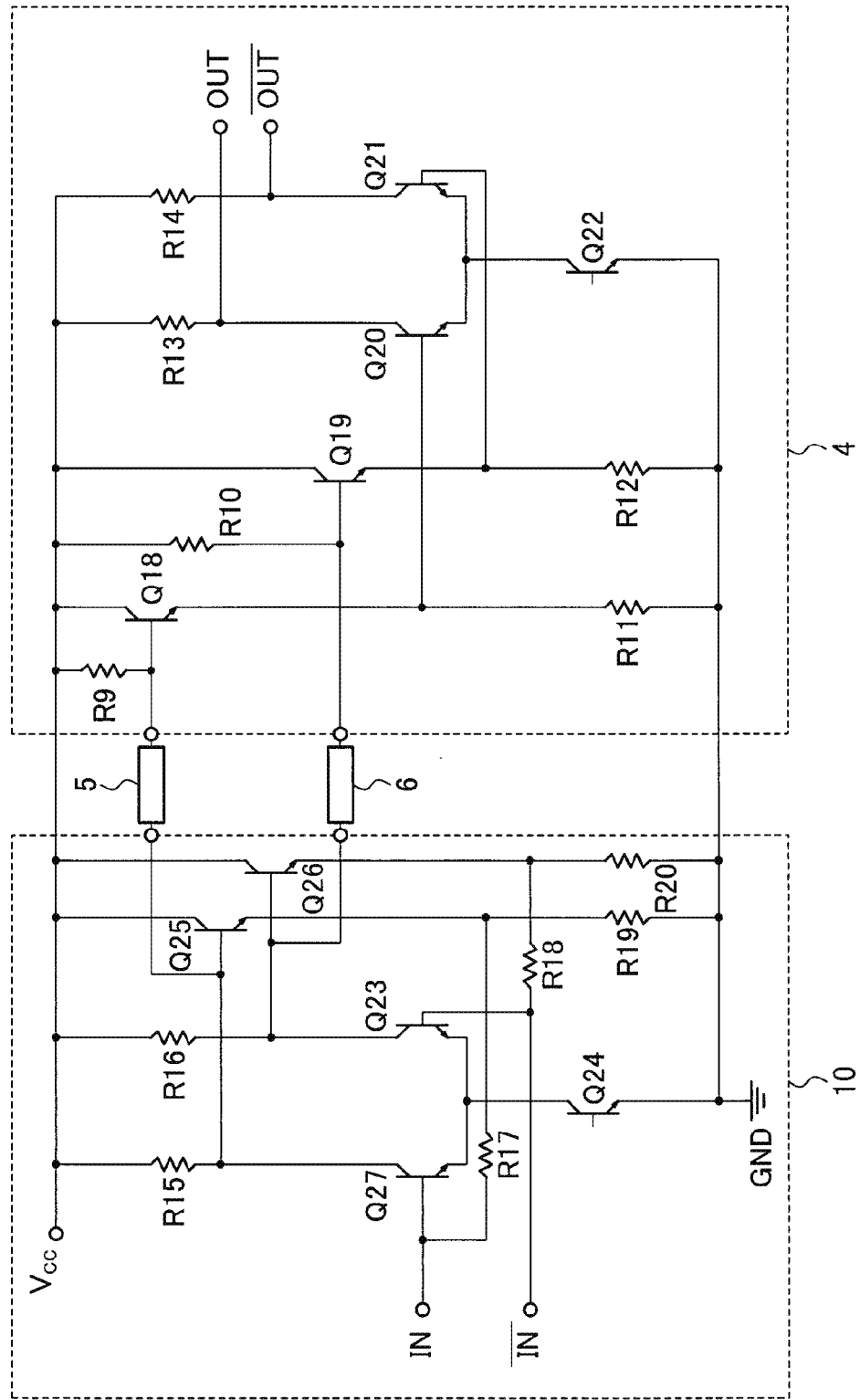
FIG. 5 is a circuit diagram (2) which shows a semiconductor integrated circuit of the second exemplary embodiment.

FIG. 5 is a figure which shows the second form of the semiconductor integrated circuit of the present invention. FIG. 5 shows an exemplary configuration in which the first stage circuit is the differential type transimpedance amplifier and an output amplifier in the latter stage of the differential type transimpedance amplifier is arranged. The differential type transimpedance amplifier of FIG. 5 indicates a circuit configuration by a bipolar transistor.

The differential type transimpedance amplifier of FIG. 5 has a differential amplifier circuit composed of transistors Q27 and Q23, load resistances R15 and R16 and a constant current source transistor Q24. Moreover, the differential type transimpedance amplifier of FIG. 5 has transistors Q25 and Q26 connected to an output terminal of this differential amplifier circuit and an emitter follower circuit composed of load resistances R19 and R20. Moreover, the differential type transimpedance amplifier of FIG. 5 has feedback resisters R17 and R18 connected between the output terminal of an emitter follower circuit and the input terminal of the differential amplifier circuit mentioned above. GND represents a ground terminal and VCC represents a power supply terminal.

An output amplifier 4 of the latter stage has input resistance R9 and R10 which will be an input terminating resistance of the latter stage and input transistors Q18 and Q19 of the emitter follower circuit as shown in FIG. 5. Moreover, an output amplifier 4 in the latter stage is composed of load resistances R11 and R12 of the emitter follower circuit, driving transistors Q20 and Q21 of the amplifier circuit, load resistances R13 and R14 of the amplifier circuit and a current source transistor Q22.

The output of the differential transimpedance amplifier 10 is pulled out from between the differential amplifier circuit of the differential transimpedance amplifier 10 and the emitter follower circuit composed of transistors Q25 and Q26, and inputted to the emitter follower circuit of the output amplifier 4.

Here, an example of the impedance matching between the differential transimpedance amplifier 10 and the output amplifier 4 will be described. Load resistances R15 and R16 of the differential amplifier circuit of the differential transimpedance amplifier 10 operate as an output terminating resistance of the first stage circuit while input resistances R9 and R10 of the emitter follower circuit of the output amplifier 4 operate as an input terminating resistance of the latter stage circuit.

Figure 6:
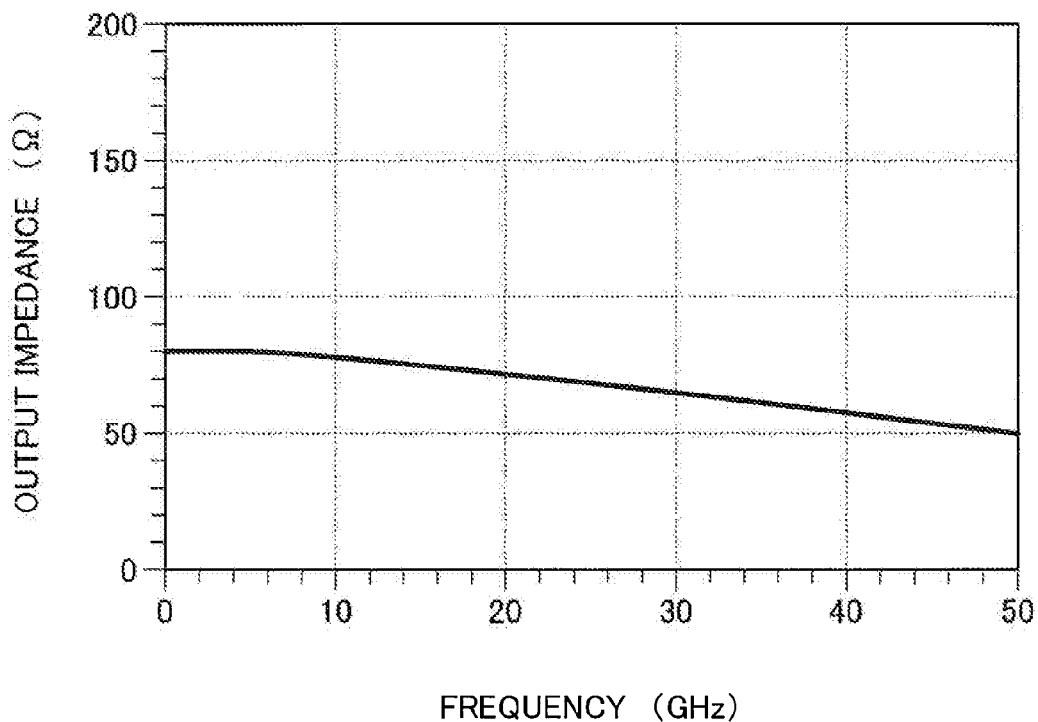
FIG. 6 is a characteristic diagram (3) of the exemplary embodiment of a semiconductor integrated circuit of the second exemplary embodiment.
Figure 7:
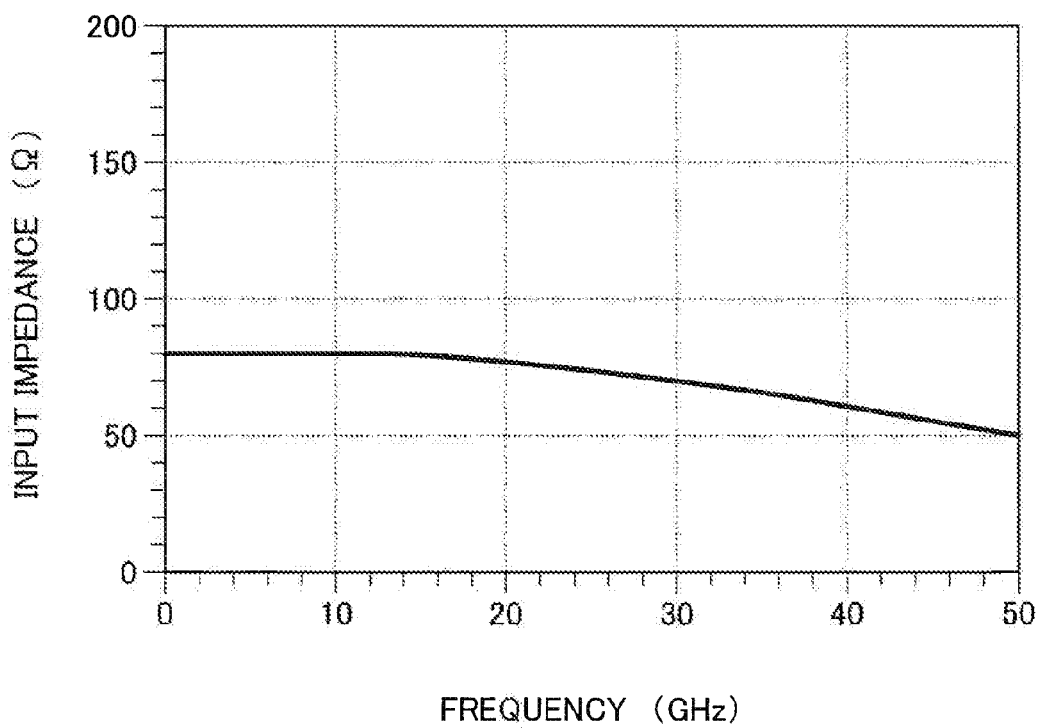
FIG. 7 is a characteristic diagram (4) of the exemplary embodiment of a semiconductor integrated circuit of the second exemplary embodiment.

The frequency characteristic of the output impedance observed from the output terminal of the differential transimpedance amplifier 10 is shown in FIG. 6. As an example, FIG. 6 indicates the output impedance of the differential transimpedance amplifier when using 80Ω resistance for the differential pair load resistances R15 and R16 of the differential transimpedance amplifier. According to FIG. 6, the output impedance of the differential transimpedance amplifier 10 is approximately 80Ω from DC to 50 GHz. The frequency characteristic of the input impedance observed from an input terminal of the output amplifier 4 is shown in FIG. 7. An 80Ω resistance is employed as the input resistances R9 and R10 of the emitter follower circuit of the output amplifier 4 as an example here. In this case, the input impedance of the output amplifier 4 is approximately 80Ω from DC to 50 GHz.

Wiring 5 and 6 between the differential transimpedance amplifier 10 and the output amplifier 4 are shown in FIG. 3, for example. The wiring is formed in which the first wiring layer is made as a ground conductor 8 and the second wiring layer 7 with 4 μm width and 2.8 μm thickness is used via an interlayer insulating film 9 of $SiO_2$ with 7 μm thickness. This wiring is microstrip line wiring, and its characteristic impedance will be about 80Ω. Although an example of wiring 5 and 6 has been described for the explanation, the wiring 5 and 6 are not limited to this configuration.

By the reason mentioned above, the output impedance of the differential transimpedance amplifier 10, the input impedance of the output amplifier 4 and the characteristic impedance of the wiring 5 and 6 are matched among three parties each other. Accordingly, without generating the gain peaking in the frequency characteristic or without generating the distortion in the data signal, the data signal can be amplified and transmitted correctly.

A signal is outputted to the latter stage circuit between the differential amplifier circuit of the differential transimpedance amplifier and the emitter follower circuit composed of transistors Q25 and Q26 in this exemplary embodiment as mentioned above.

The output impedance of the differential transimpedance amplifier 10 operating as an output terminating resistance of the first stage circuit is flat mostly over the bandwidth which the signal covers. Accordingly, the wide bandwidth impedance matching can be formed between the input impedance of the latter stage circuit and the characteristic impedance of the wiring between the stages.

Incidentally, the output position to the latter stage is made between the differential amplifier circuit of the differential transimpedance amplifier and the emitter follower circuit composed of transistors Q25 and Q26 in this exemplary embodiment. However, when the position satisfies the following condition, the output may be taken out from other positions of the circuit:

i) The output impedance is same as the input impedance of the latter stage and the characteristic impedance of the wiring between the latter stage input.

ii) The output impedance is constant over the bandwidth which the signal covers.

iii) An equivalent signal (similar signal) to the signal which is tried to be transmitted to the next stage can be drawn out.

In this exemplary embodiment, although the usage case of a bipolar transistor has been described, other devices such as a field effect transistor (FET) of GaAs and a MOS can be used.

The Third Exemplary Embodiment

Figure 8:
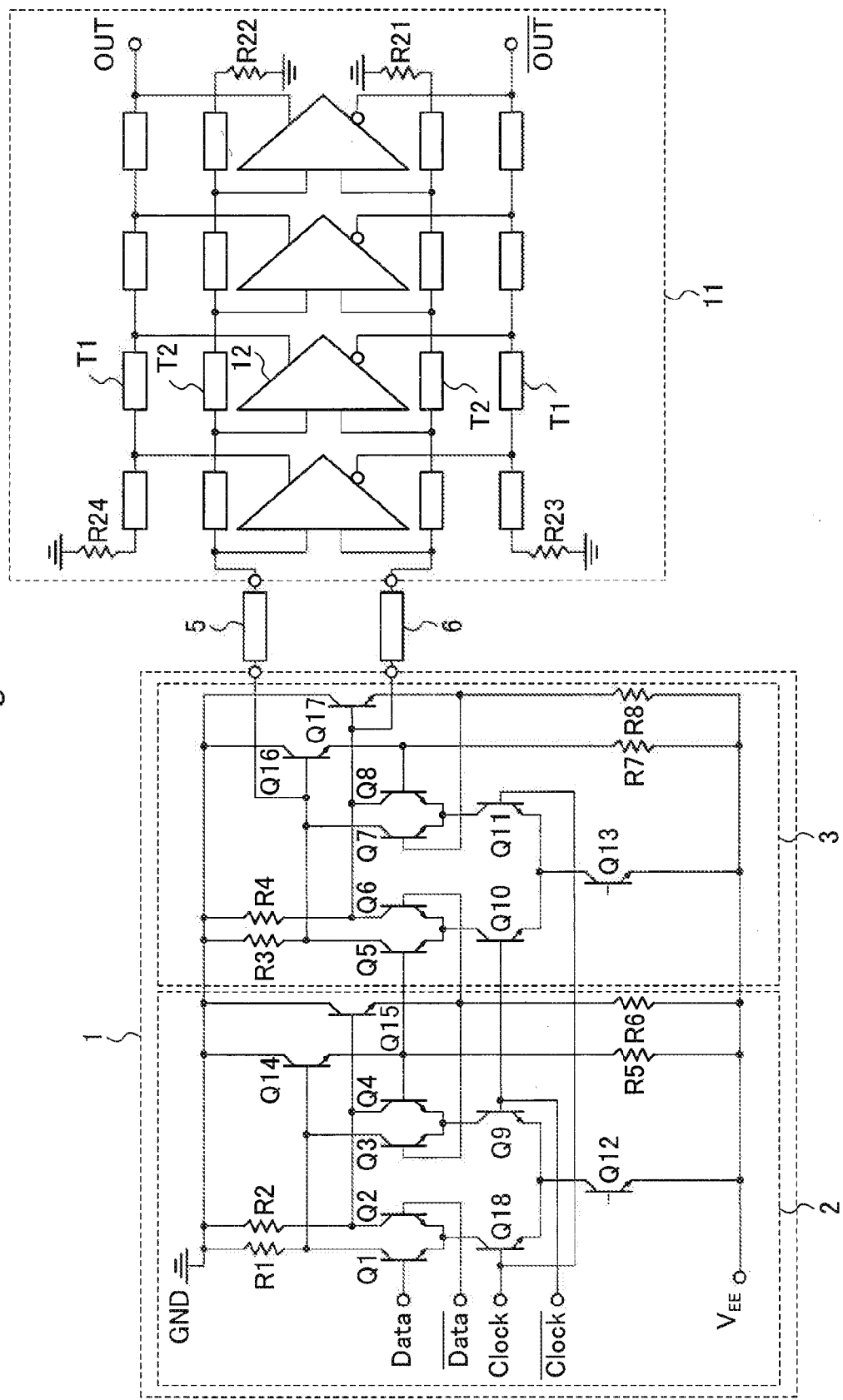
FIG. 8 is a circuit diagram (3) which shows a semiconductor integrated circuit of the third exemplary embodiment.

FIG. 8 is a figure which shows the third form of the semiconductor integrated circuit of the present invention and which indicates an exemplary configuration in which the first stage circuit is a flip-flop circuit and a differential distribution type amplifier is arranged in the latter stage of the flip-flop circuit. A flip-flop circuit 1 of FIG. 8 indicates a circuit configuration by a bipolar transistor.

The master circuit 2 has a data reading circuit composed of the resistance elements R1 and R2, and the transistors Q1, Q2 and Q18. The master circuit 2 further has a data holding circuit composed of the resistance element R1 and R2, and the transistors Q3, Q4, and Q9 and a data holding positive feedback circuit composed of the emitter follower circuit of the transistors Q14 and Q15 and the resistance elements R5 and R6. The master circuit 2 further has a current source circuit composed of the transistor Q12 connected to a common emitter of the transistors Q8 and Q9.

The slave circuit 3 has a data reading circuit composed of the resistance elements R3 and R4 and the transistors Q5, Q6 and Q10. The slave circuit 3 further has a data holding circuit composed of the resistance elements R3 and R4 and transistors Q7, Q8 and Q11, and a data holding positive feedback circuit composed of an emitter follower circuit of the transistors Q16 and Q17 and resistance elements R7 and R8. The slave circuit 3 further has a current source circuit composed of the transistor Q13 connected to a common emitter of the transistors Q10 and Q11. GND represents a ground terminal and VEE represents a power supply terminal.

Figure 9:
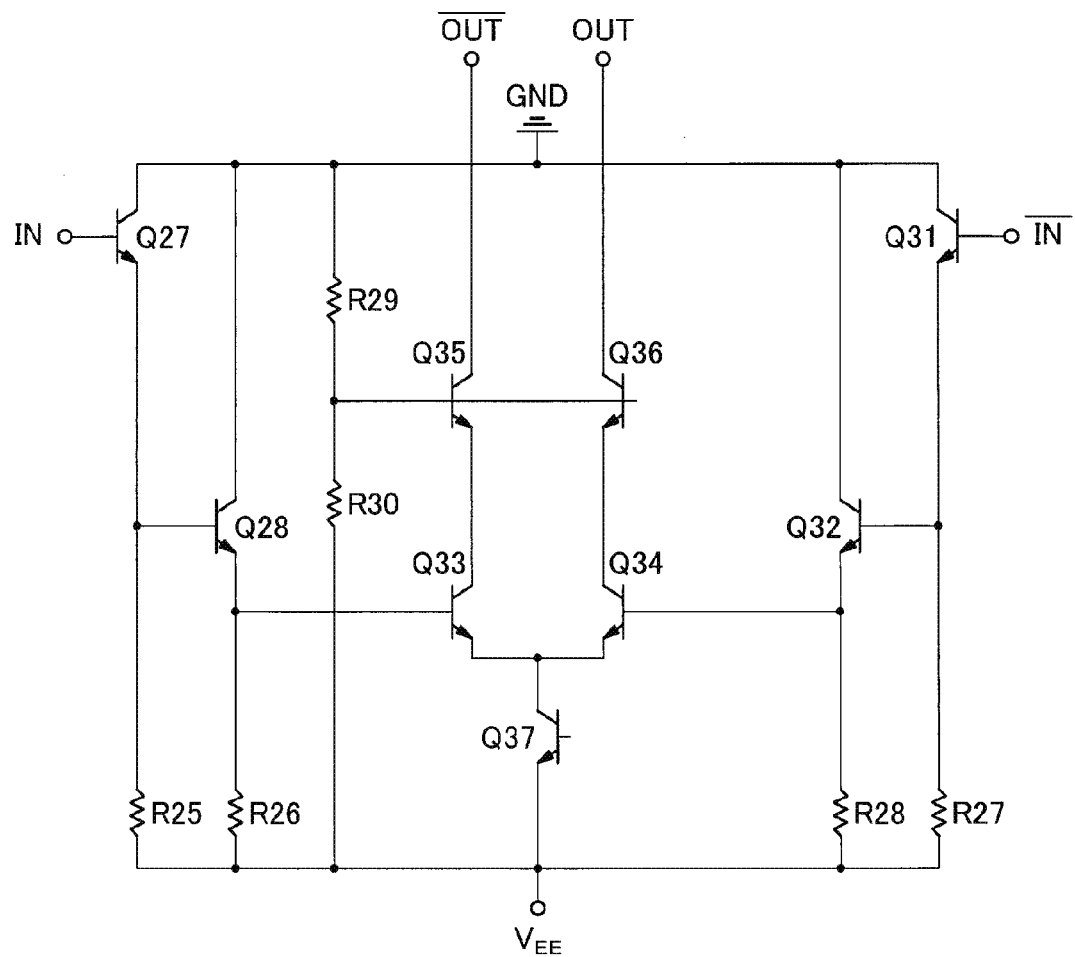
FIG. 9 is a circuit diagram (1) which illustrates the exemplary embodiment of a semiconductor integrated circuit of the third exemplary embodiment.

As shown in FIG. 8, the differential distribution type amplifier 11 of the latter stage is composed of the input side distributed parameter transmission line T2, the input terminating resistances R21 and R22, the output side distributed parameter transmission line T1, the output terminating resistances R23 and R24 and four stages of the unit differential amplifier circuit 12. The unit differential amplifier circuit 12 has a differential configuration composed of two stages of the emitter follower circuit and the cascade type differential circuit as shown in FIG. 9.

The output of the slave circuit 3 of the flip-flop circuit 1 is drawn out from between the differential pair of a data reading circuit of the slave circuit 3 and the emitter follower circuit of a data holding positive feedback circuit and is outputted, and inputted to the differential distribution type amplifier 11.

Here, an example of impedance matching between the flip-flop circuit 1 and the differential distribution type amplifier 11 will be described. The differential pair load resistances R3 and R4 of the slave circuit 3 of the flip-flop circuit 1 operates as an output terminating resistance of the first stage circuit, and the input terminating resistances R21 and R22 of the differential distribution type amplifier 11 operates as an input terminating resistance of the latter stage circuit.

Figure 10:
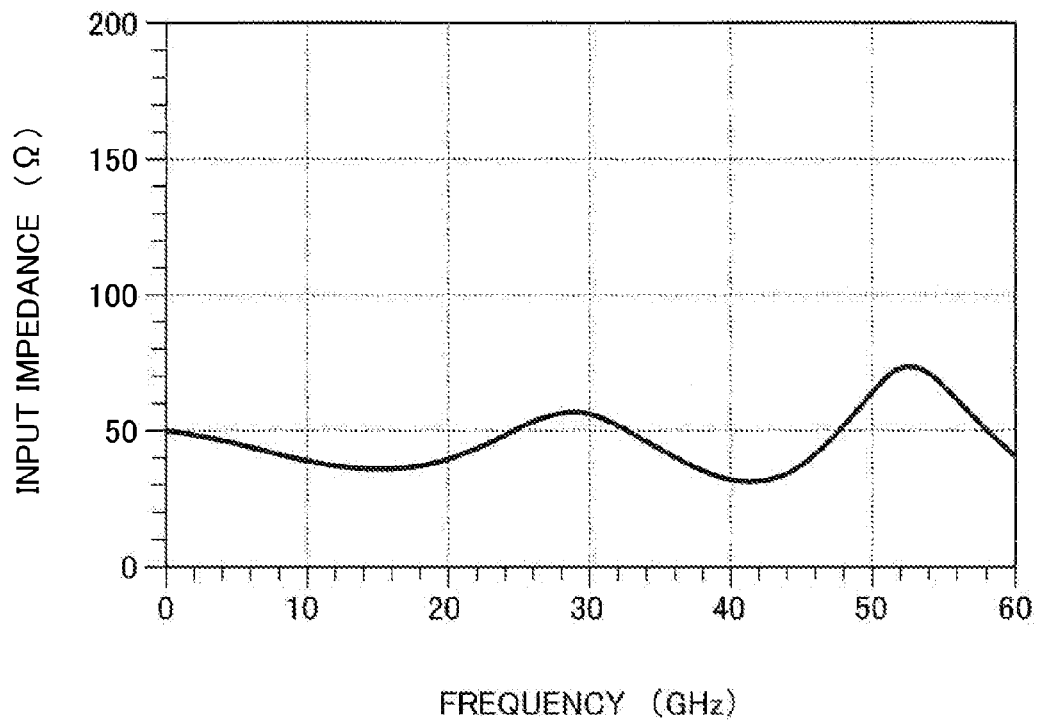
FIG. 10 is a characteristic diagram (5) of the exemplary embodiment of a semiconductor integrated circuit of the third exemplary embodiment.

The frequency characteristic of the input impedance observed from an input terminal of the differential distribution type amplifier 11 is shown in FIG. 10. When the 50Ω resistance is used for the input terminating resistances R21 and R22 of the differential distribution type amplifier 11, the input impedance of the differential distribution type amplifier 11 is approximately 50Ω from DC to 60 GHz.

Wiring 5 and 6 between the flip-flop circuit 1 and the differential distribution type amplifier 11 employs a 500 μm length coplanar line with 50Ω characteristic impedance. Accordingly, the input impedance of the differential distribution type amplifier 11 and the characteristic impedance of the wiring 5 and 6 are matched.

Figure 11:
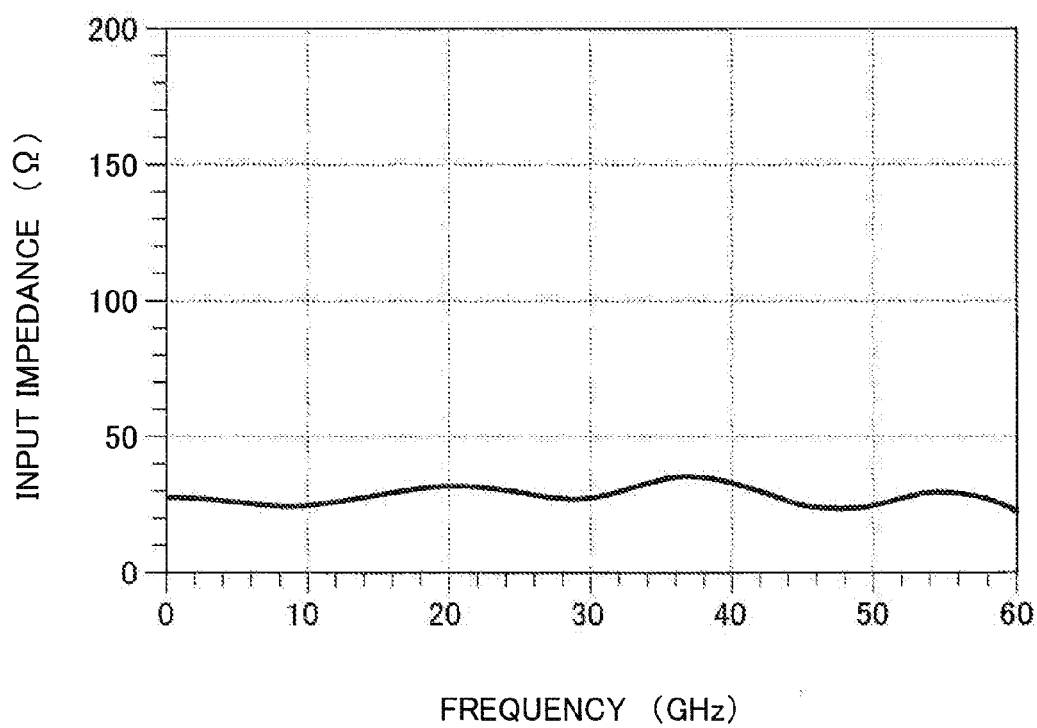
FIG. 11 is a characteristic diagram (6) of the exemplary embodiment of a semiconductor integrated circuit of the third exemplary embodiment.

FIG. 11 indicates the frequency characteristic of the input impedance of the differential distribution type amplifier 11 observed from an input edge of the differential pair load resistances R3 and R4 of the slave circuit 3 in the flip-flop circuit 1. 50Ω resistances are used for the differential pair load resistance R3 and R4 of the slave circuit. The input impedance of the differential distribution type amplifier 11 is flat in approximately 25Ω from DC to 60 GHz after connecting wiring 5 and 6 as found by FIG. 11. Accordingly, a data signal can be amplified and transmitted correctly without generating the gain peaking in the frequency characteristic, and without generating the distortion in data signal.

A signal is outputted to the latter stage circuit between the differential pair of the data reading circuit in the flip-flop circuit and the emitter follower circuit of the data holding positive feedback circuit in this exemplary embodiment as mentioned above. The output impedance of the slave circuit 3 of the flip-flop circuit 1 operating as an output terminating resistance of the first stage circuit is fixed mostly by a bandwidth which a signal has. Accordingly, it is enabled to connect directly with the input impedance of the differential distribution type amplifier in the latter stage circuit and perform the wide bandwidth impedance matching between the characteristic impedances of the wiring between the stages.

In this exemplary embodiment, although the usage case of a bipolar transistor has been described, other devices such as a field effect transistor (FET) of GaAs and a MOS can be used.

The Fourth Exemplary Embodiment

Figure 12:
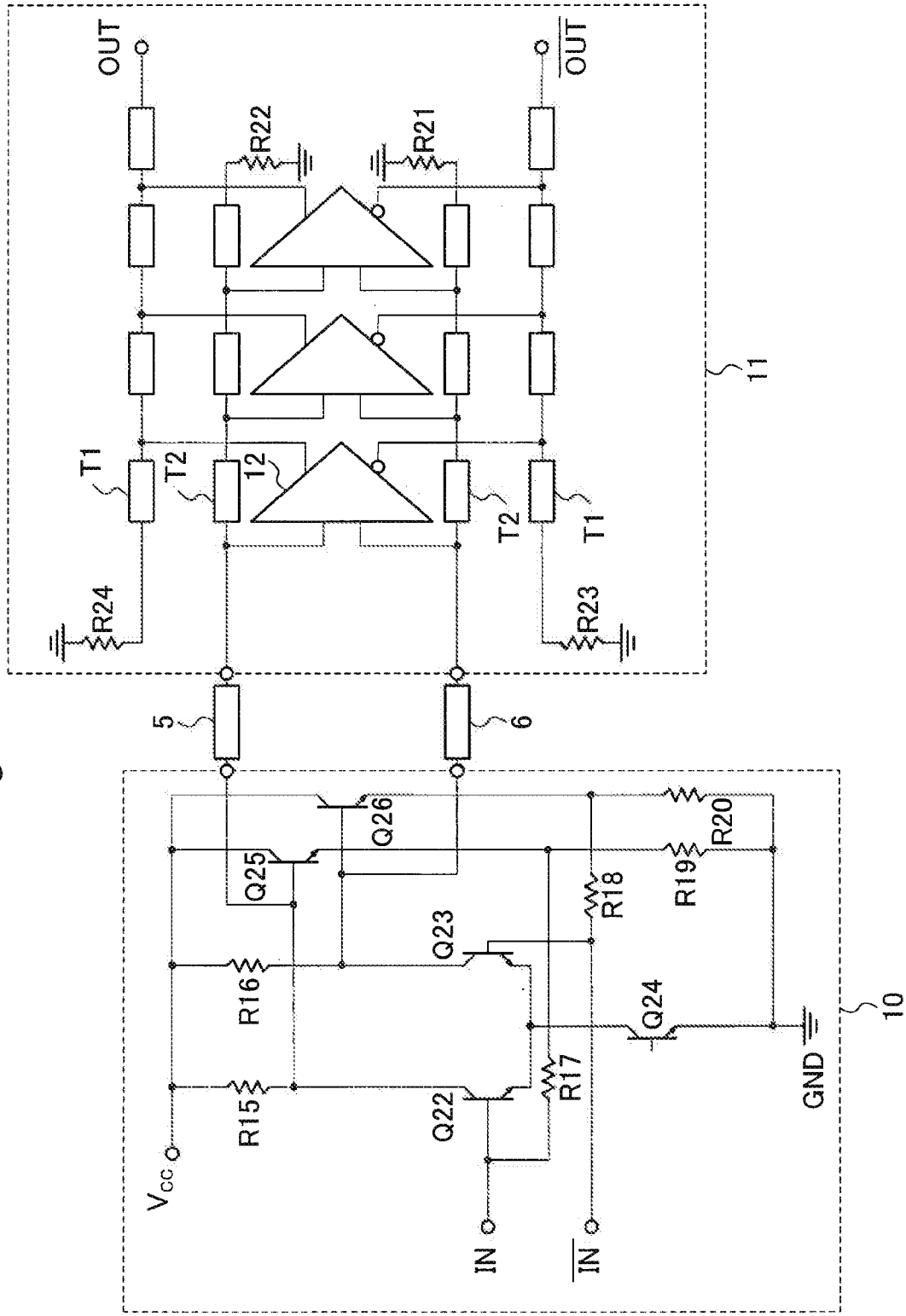
FIG. 12 is a circuit diagram (4) which shows an exemplary embodiment of a semiconductor integrated circuit of the fourth exemplary embodiment.

FIG. 12 is a figure which shows the fourth exemplary embodiment of the semiconductor integrated circuit of the present invention. FIG. 12, in which the first stage circuit is a differential transimpedance amplifier, indicates a configuration example having differential distributed amplifiers in the latter stage of the differential transimpedance amplifier. The differential type transimpedance amplifier of FIG. 12 adopts a circuit configuration by a bipolar transistor.

As shown in FIG. 12, the differential type transimpedance amplifier has a differential amplifier circuit composed of transistors Q22 and Q23, load resistances R15 and R16 and a constant current source transistor Q24. Further, the differential type transimpedance amplifier further has an emitter follower circuit composed of transistors Q25 and Q26 connected to an output terminal of this differential amplifier circuit and load resistances R19 and R20. Further, the differential type transimpedance amplifier has the feedback resisters R17 and R18 connected between the output terminal of the emitter follower circuit and the input terminal of the differential amplifier circuit mentioned above. GND represents a ground terminal and VCC represents a power supply terminal.

Figure 13:
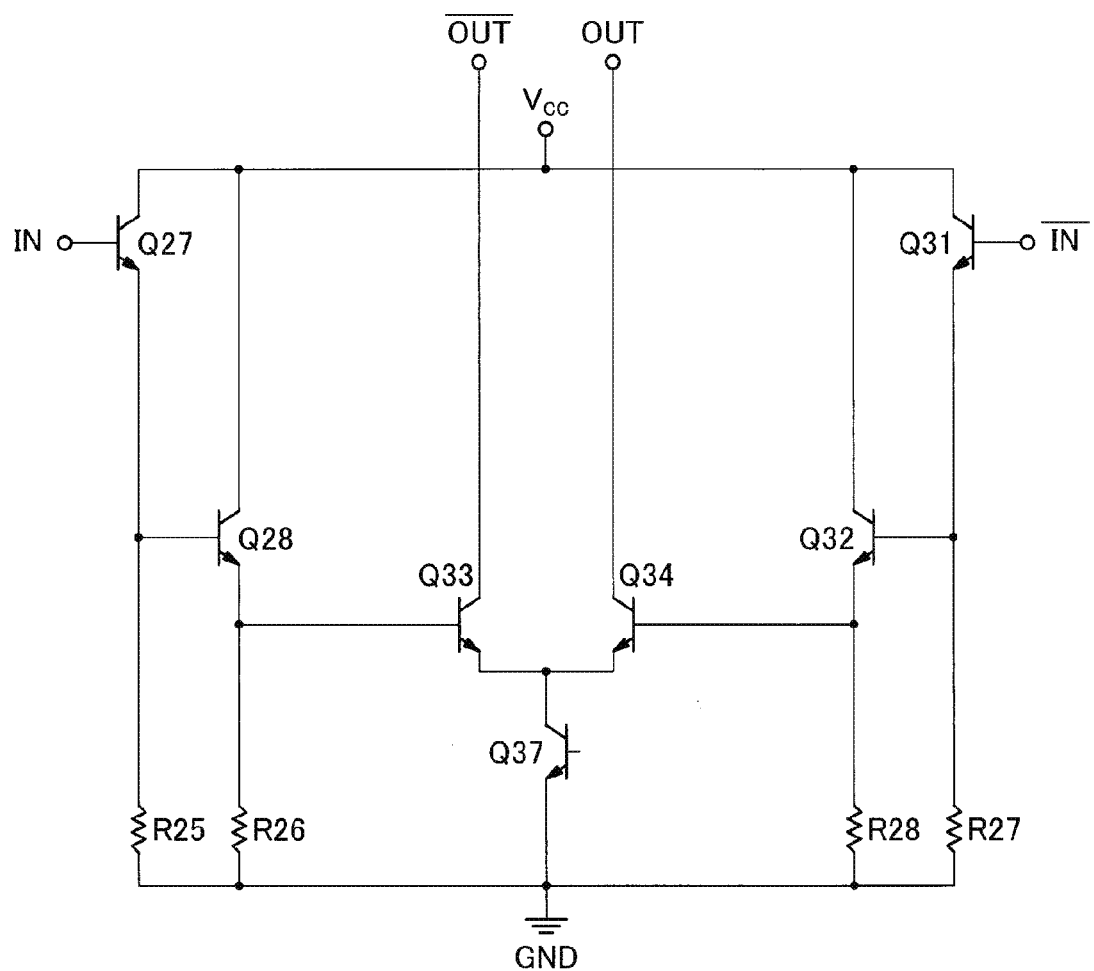
FIG. 13 is a circuit diagram (2) which illustrates the exemplary embodiment of a semiconductor integrated circuit of the fourth exemplary embodiment.

As shown in FIG. 12, the differential distribution type amplifier 11 of the latter stage is composed of the input side distributed parameter transmission line T2, the input terminating resistances R21 and R22, the output side distributed parameter transmission line T1, the output terminating resistances R23 and R24 and four stages of the unit differential amplifier circuit 12. The unit differential amplifier circuit 12 is composed of two stages of the emitter follower circuit and the differential circuit as shown in FIG. 13.

The output of the differential transimpedance amplifier 10 is drawn out from between the differential amplifier circuit of the differential transimpedance amplifier 10 and the emitter follower circuit, and is outputted, and then inputted to the differential distribution type amplifier 11.

Figure 14:
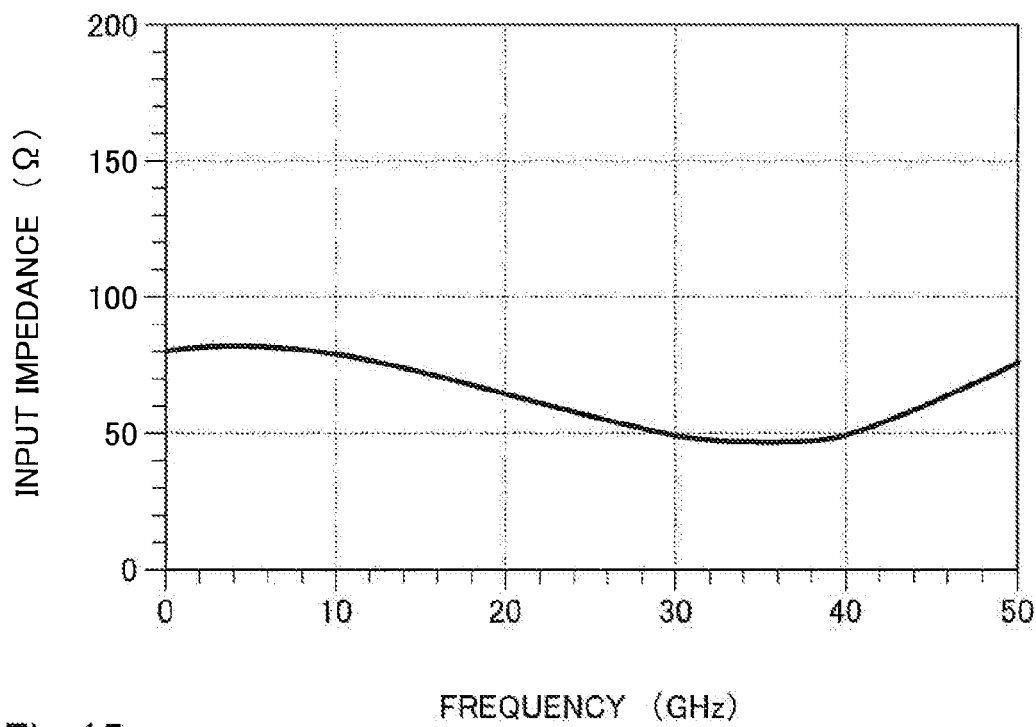
FIG. 14 is a characteristic diagram (7) of the exemplary embodiment of a semiconductor integrated circuit of the fourth exemplary embodiment.

Here, an example of the impedance matching between the differential transimpedance amplifier 10 and the differential distribution type amplifier 11 will be described. The load resistances R15 and R16 of the differential amplifier circuit in the differential transimpedance amplifier 10 operate as an output terminating resistance of the first stage circuit, and the input terminating resistances R21 and R22 of the differential distribution type amplifier 11 operate as an input terminating resistance of the latter stage circuit. The frequency characteristic of the output impedance observed from an output terminal of the differential transimpedance amplifier 10 is shown in FIG. 14. When 80Ω resistance is used for the differential pair load resistances R15 and R16 of the differential transimpedance amplifier, the output impedance of the differential transimpedance amplifier 10 is approximately 80Ω from DC to 50 GHz. When 80Ω resistance is used for the input terminating resistances R21 and R22 of the differential distribution type amplifier 11, the input impedance of the differential distribution type amplifier 11 is approximately 40Ω from DC to 60 GHz. Wiring 5 and 6 between the differential transimpedance amplifier 10 and the differential distribution type amplifier 11 uses an 1 mm length coplanar line with the 80Ω characteristic impedance. Accordingly, the input impedance of the differential distribution type amplifier 11 and the characteristic impedance of the wiring 5 and 6 are matched.

Figure 15:
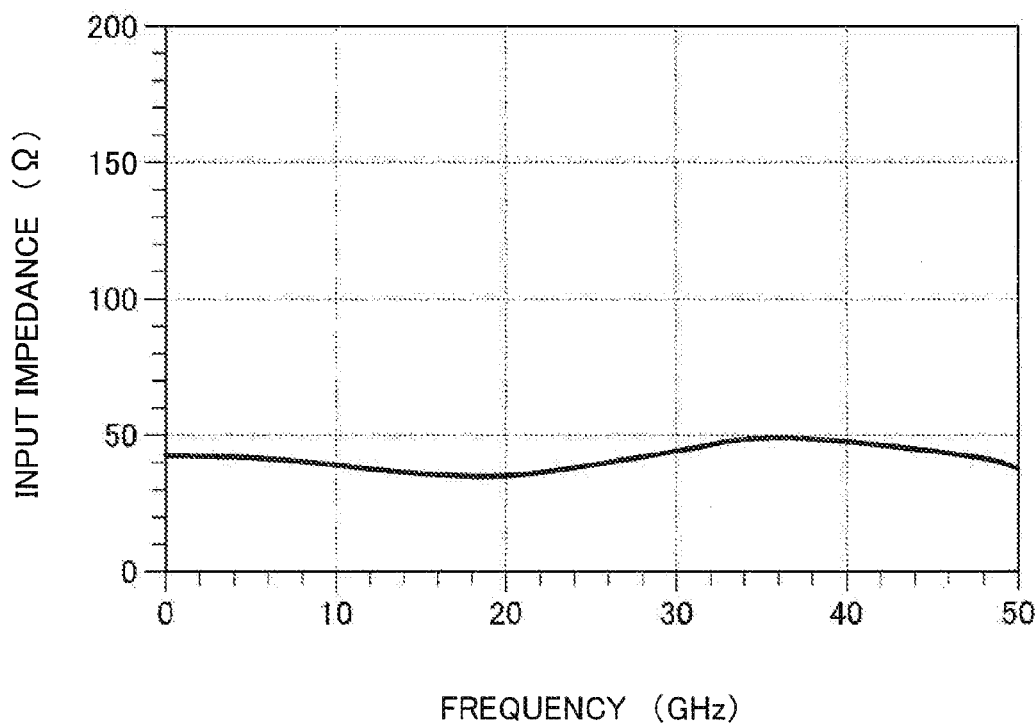
FIG. 15 is a characteristic diagram (8) of the exemplary embodiment of a semiconductor integrated circuit of the fourth exemplary embodiment.
Figure 16:
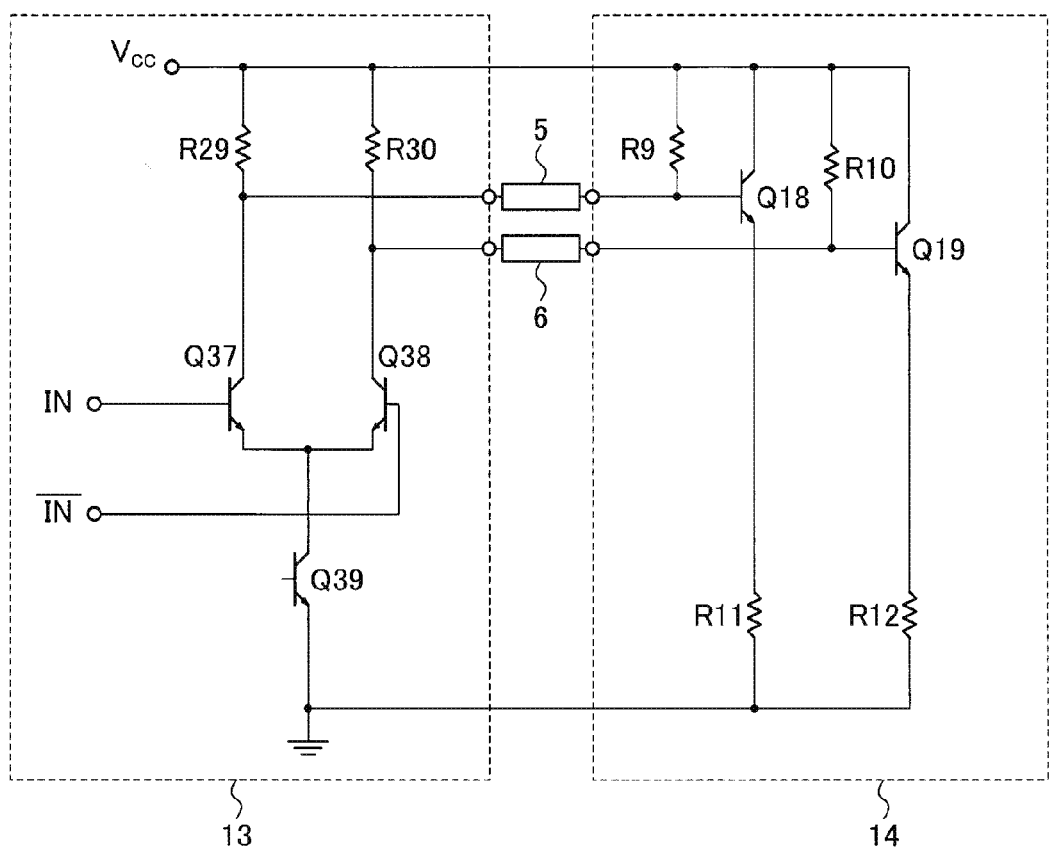
FIG. 16 is a circuit diagram (1) which shows a related semiconductor integrated circuit.
Figure 17:
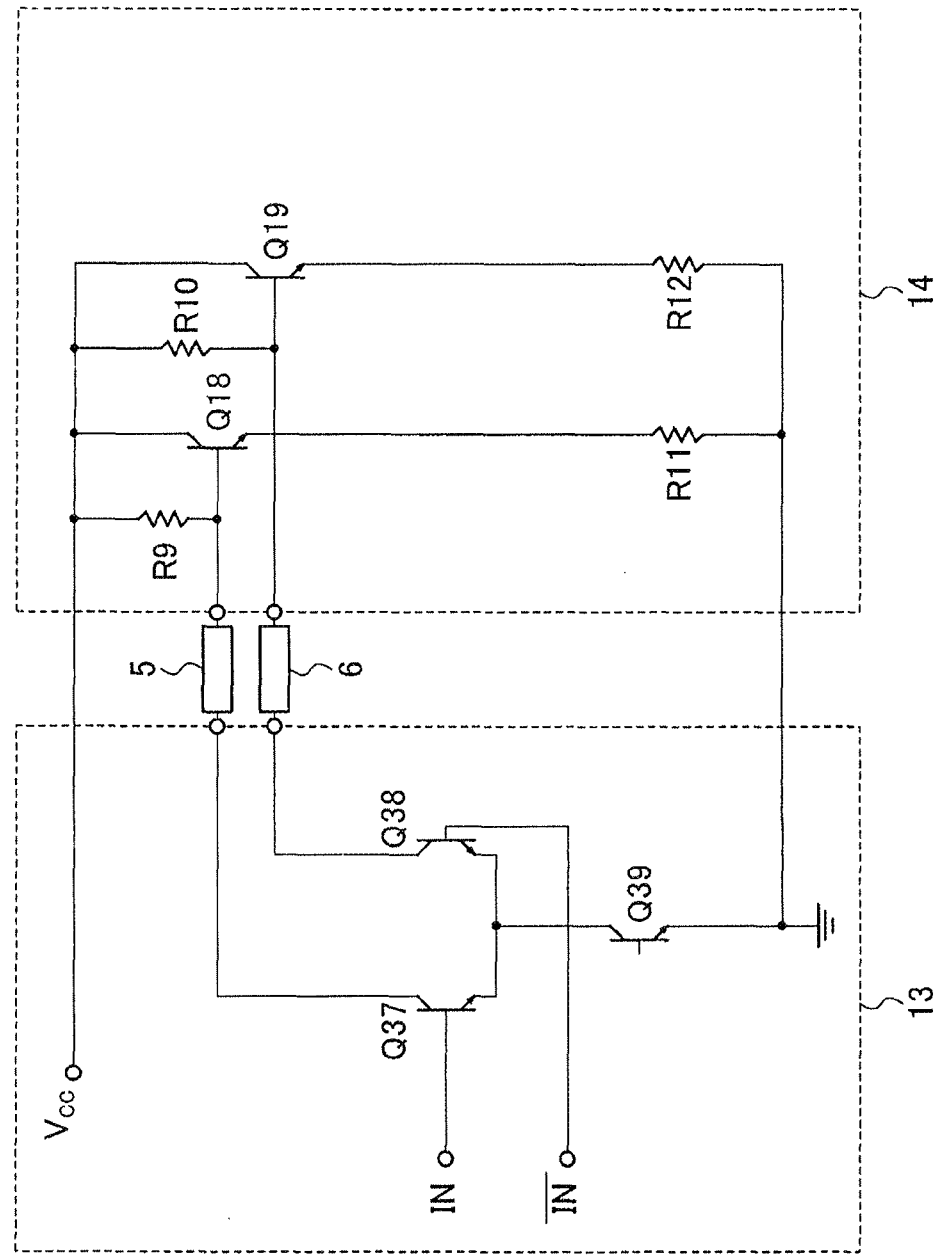
FIG. 17 is a circuit diagram (2) which shows a related semiconductor integrated circuit.
Figure 18:
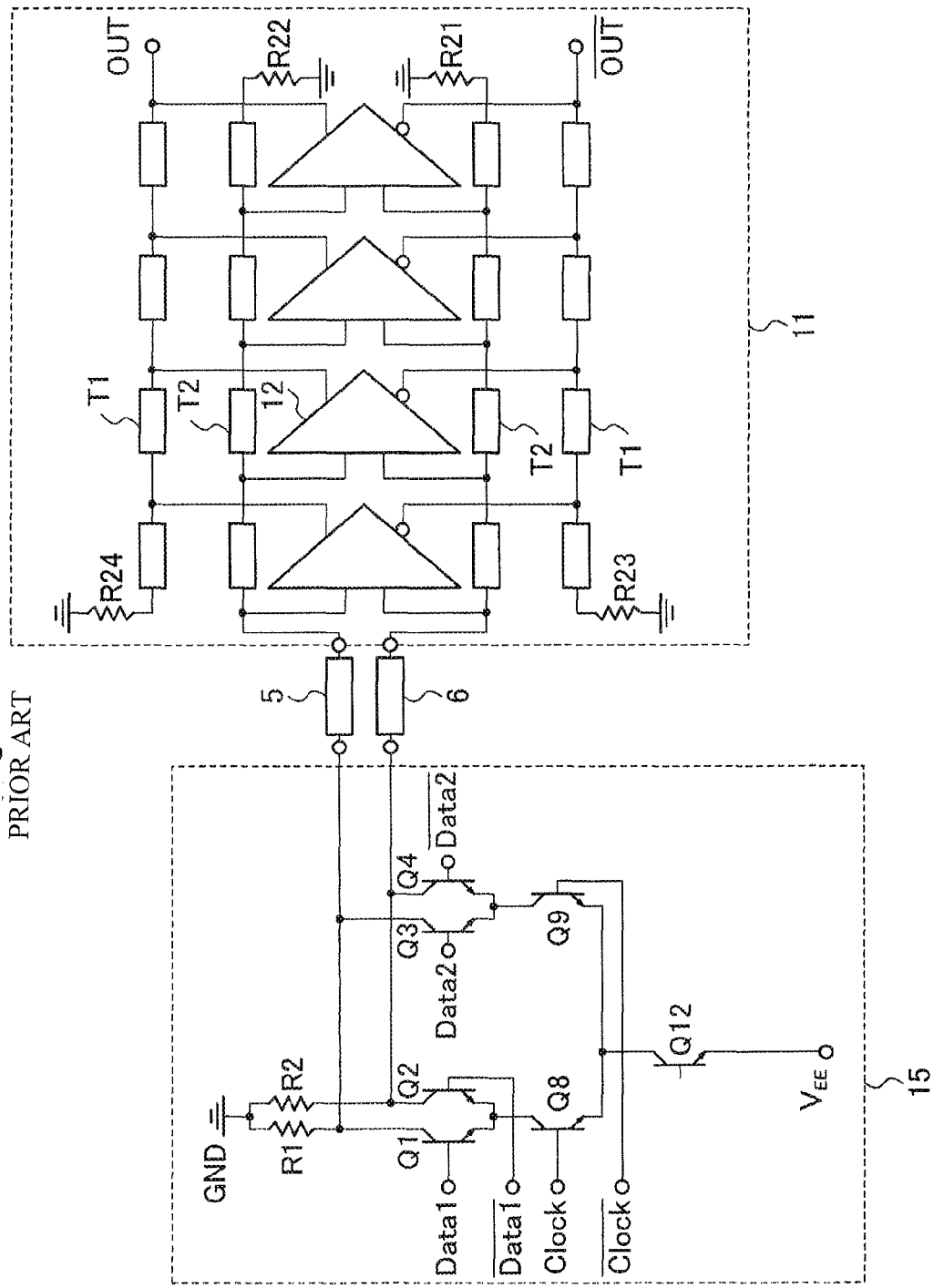
FIG. 18 is a circuit diagram (3) which shows a related semiconductor integrated circuit.
Figure 19:
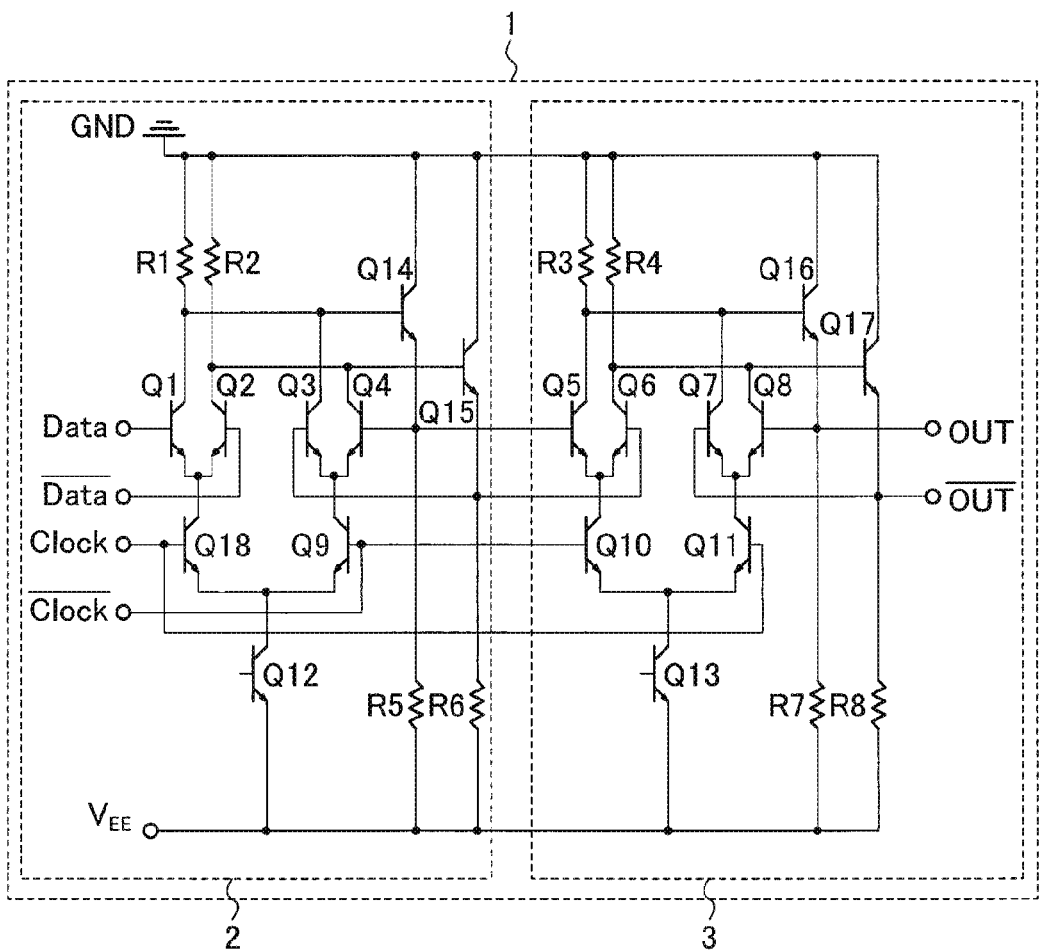
FIG. 19 is a circuit diagram (4) which shows a related semiconductor integrated circuit.
Figure 20:
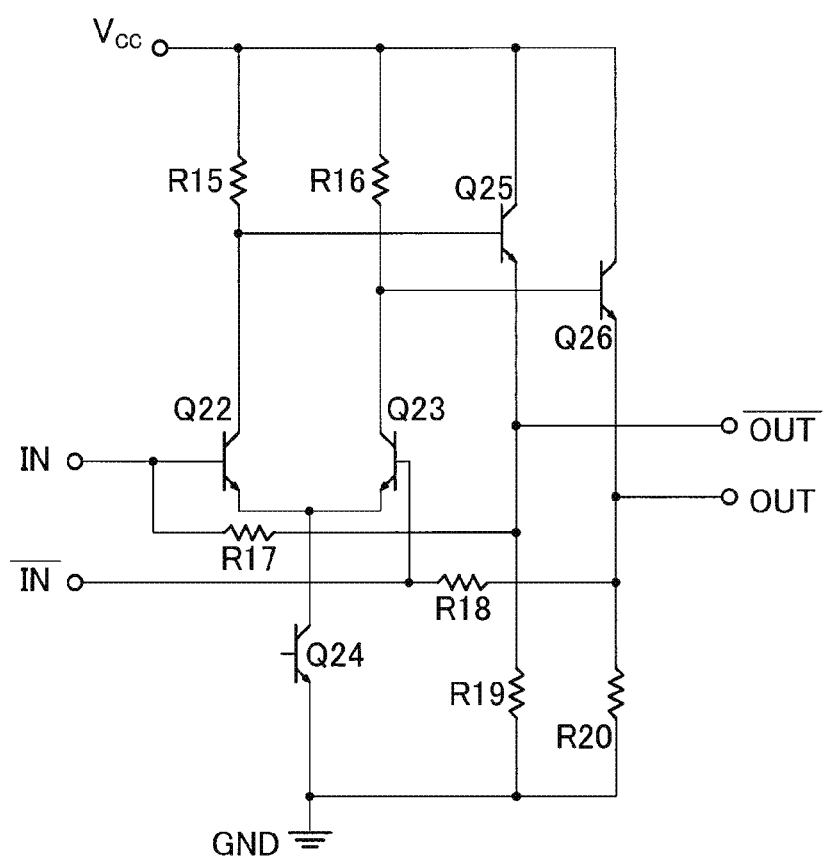
FIG. 20 is a circuit diagram (5) which shows a related semiconductor integrated circuit.

Therefore, the output impedance of the differential transimpedance amplifier 10, the input impedance of the differential distribution type amplifier 11 and the characteristic impedance of the wiring 5 and 6 will be matched among three parties each other. Accordingly, without generating the gain peaking in the frequency characteristic and without generating the distortion in a data signal, the data signal can be amplified and transmitted correctly. The input impedance of the differential distribution type amplifier 11 observed from an input edge of the load resistances R15 and R16 of the differential circuit of a differential transimpedance amplifier 10 is shown in FIG. 15. The input impedance of the differential distribution type amplifier 11 is flat in approximately 40Ω from DC to 50 GHz after connecting the wiring 5 or 6 as found by FIG. 15.

As mentioned above, a signal is drawn out from between the differential amplifier circuit of the differential transimpedance amplifier and the emitter follower circuit and outputted in this exemplary embodiment. The output impedance is mostly flat in the bandwidth which a signal covers in the output of the differential transimpedance amplifier 10 operating as the output terminating resistance of the first stage circuit. Accordingly, the wide bandwidth impedance matching can be formed between the input impedance of the latter stage circuit and the characteristic impedance of the wiring between the stages.

Incidentally, the output position to the latter stage is made between the differential amplifier circuit of the differential transimpedance amplifier and the emitter follower circuit in this exemplary embodiment. However, when the position satisfies the following condition, the output may be taken out from other positions of the circuit:

i) The output impedance is same as the input impedance of the latter stage and the characteristic impedance of the wiring between the latter stage inputs.

ii) The output impedance is constant over the bandwidth which the signal covers.

iii) An equivalent signal (similar signal) to the signal which tries to be transmitted to the next stage can be drawn out.

In this exemplary embodiment, although the usage case of a bipolar transistor has been described, other devices such as a field effect transistor (FET) of GaAs and a MOS can be used.

The Fifth Exemplary Embodiment

Next, the fifth exemplary embodiment of the present invention will be described.

Figure 21:
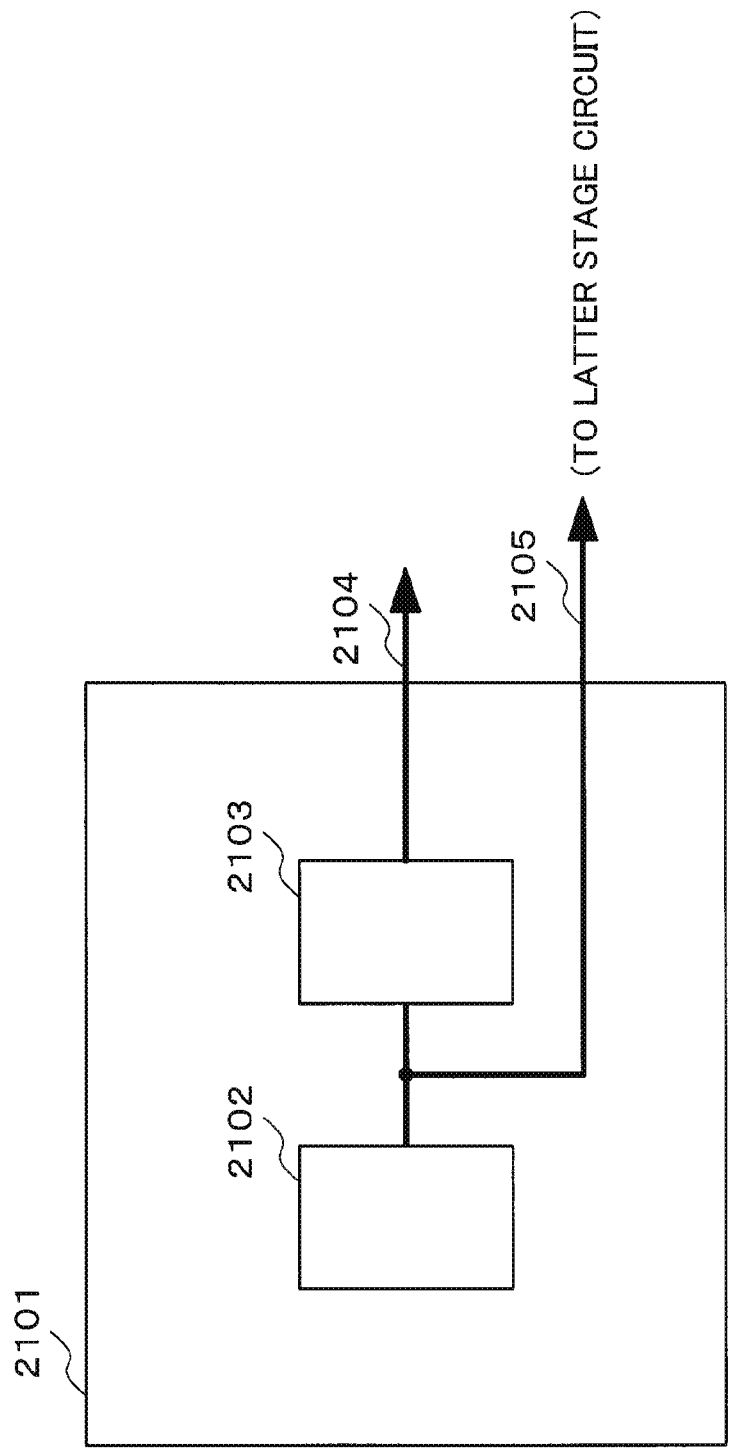
FIG. 21 is a figure which shows a semiconductor integrated circuit of the fifth exemplary embodiment.

FIG. 21 is a semiconductor integrated circuit of the fifth exemplary embodiment of the present invention.

A semiconductor integrated circuit 2101 of this exemplary embodiment has the first circuit 2102 and the second circuit 2103 having the first output 2104 connected to the first circuit. In addition, in the semiconductor integrated circuit 2101, a second output 2105 that is a signal similar to the first output is outputted between the first circuit and the second circuit.

The semiconductor integrated circuit 2101 of this exemplary embodiment has the following feature. The output impedance between the first circuit and second circuit, the input impedance of the circuit connected to the latter stage of the second circuit and the characteristic impedance of the wiring which connects the second output and a circuit connected to the latter stage of the second circuit are equal each other.

According to the fifth exemplary embodiment described above, the following semiconductor integrated circuit can be provided. That is, the feedback amplifier circuit and the latter stage circuit of the first stage circuit can be connected directly and the wide bandwidth impedance matching can be formed between the stages of the first stage circuit and the latter stage circuit. Accordingly, the semiconductor integrated circuit capable of amplification or transmission of a data signal without generating the distortion and the gain peaking of the frequency characteristic is provided.

The Sixth Exemplary Embodiment

Next, the sixth exemplary embodiment of the present invention will be described.

Figure 22:
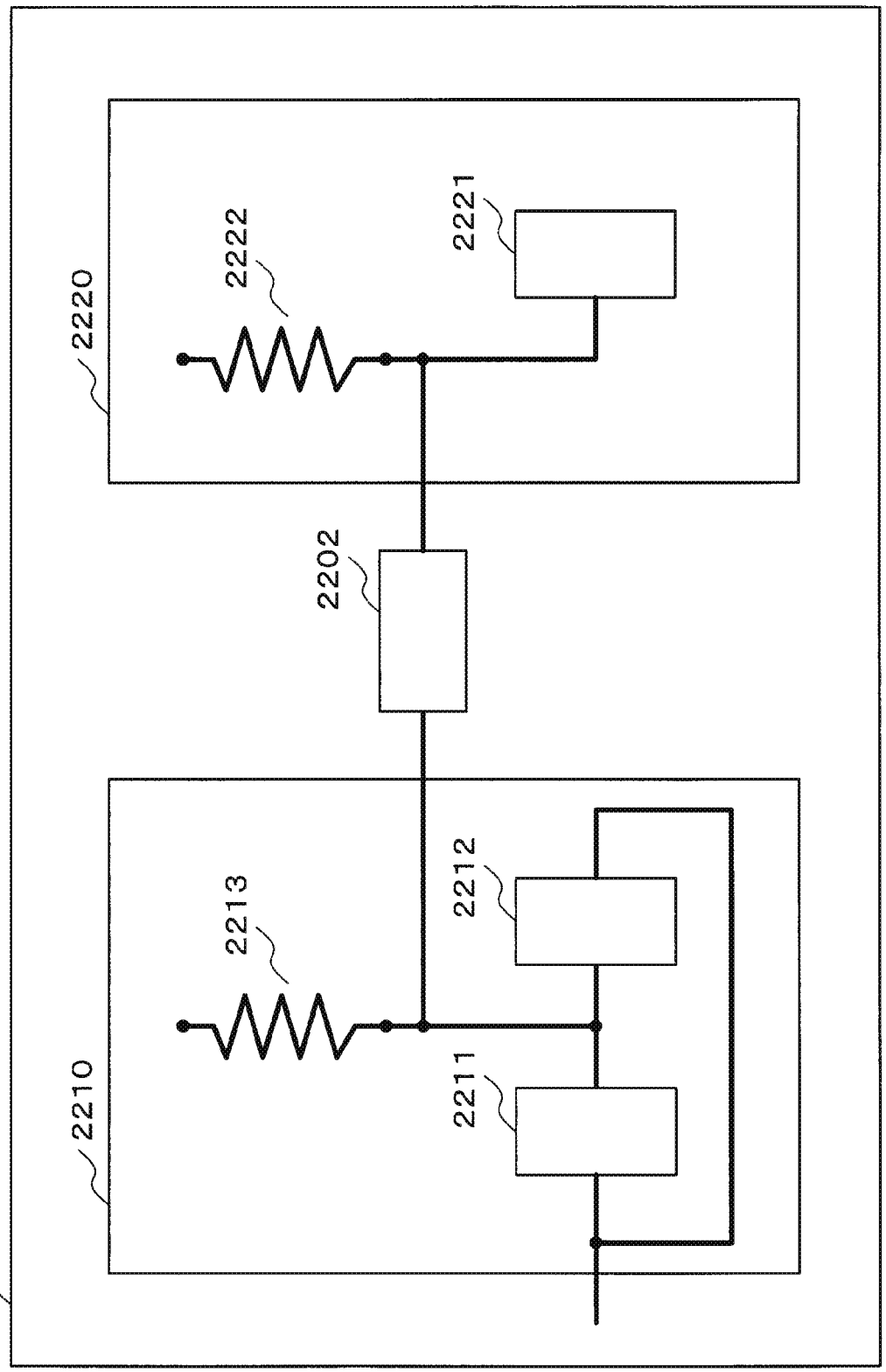
FIG. 22 is a figure which shows a semiconductor integrated circuit of the sixth exemplary embodiment.

FIG. 22 is a semiconductor integrated circuit of the sixth exemplary embodiment of the present invention.

A semiconductor integrated circuit 2201 of this exemplary embodiment is a semiconductor integrated circuit composed of the first circuit 2210, the second circuit 2220 which is different from the first circuit 2210 and wiring 2202 which connects the first circuit and the second circuit.

The first circuit 2210 has the third circuit 2211 including an input part and an output part, a feedback circuit 2212 including an input part and an output part and a load resistance 2213, and the output part of the feedback circuit and the input part of the third circuit are connected.

Further, the input parts of the feedback circuit and the output parts of the third circuit are connected with the load resistance.

The second circuit 2220 has the fourth circuit 2221 and a terminating resistance 2222 connected with the fourth circuit. By connecting one end of the wiring to the load resistance and connecting the other edge of the wiring to the terminating resistance, the output impedance of the first circuit, the input impedance of the second circuit and the characteristic impedance of the wiring are matched.

According to the sixth exemplary embodiment described above, the following semiconductor integrated circuit can be provided. That is, a feedback amplifier circuit and the latter stage circuit of the first stage circuit can be connected directly and the wide bandwidth impedance matching can be formed between the stages of the first stage circuit and the latter stage circuit. Accordingly, a semiconductor integrated circuit capable of amplification or transmission of a data signal without generating the distortion and the gain peaking of the frequency characteristic is provided.

Although the present invention has been described with reference to the exemplary embodiments above, the present invention is not limited to the exemplary embodiment mentioned above. The various changes which a person skilled in the art can understand in the scope of the present invention can be performed in the composition and its details of the present invention.

This application claims priority based on Japanese Patent Application No. 2011-087418, filed on Apr. 11, 2011, the disclosure of which is hereby incorporated by reference in its entirety.

INDUSTRIAL APPLICABILITY

The present invention relates to a feedback amplifier circuit and a high speed semiconductor integrated circuit in particular which processes wide bandwidth data signals and has the availability on the industry.

REFERENCE SIGN LIST

1 Flip-flop circuit.
2 Master circuit.
3 Slave circuit.
4 Output amplifier.
5 Inter-stage wiring.
6 Inter-stage wiring.
7 Second wiring layer.
8 First wiring layer (Ground conductor).
9 Interlayer insulating film ($SiO_2$).
10 Differential transimpedance amplifier.
11 Differential distribution type amplifier.
12 Unit amplifier circuit of a differential distribution type amplifier.
13 Current switch differential circuit.
14 Emitter follower circuit.
15 2-to-1 Selector core circuit

What is claimed is:

1. A semiconductor integrated circuit, comprising:
a first circuit;
a second circuit that is different from said first circuit; and
wiring that connects said first circuit and said second circuit, wherein
said first circuit is equipped with a third circuit having an input part and an output part, a feedback circuit to feedback from the output part of said third circuit to the input part of said third circuit, and a load resistance,
said second circuit is equipped with a fourth circuit and a terminating resistance connected to said fourth circuit, and
an output impedance of said first circuit, an input impedance of said second circuit and a characteristic impedance of said wiring are equal to each other,
wherein one end of said wiring is connected to said load resistance and the other end of said wiring is connected to said terminating resistance, and
the one end of the wiring is directly connected only to a portion between an input part of the feedback circuit and the output part of the third circuit, the portion being connected to the load resistance.

2. The semiconductor integrated circuit according to claim 1, wherein
said fourth circuit comprises emitter follower circuit, and
said output impedance of said first circuit, said characteristic impedance of said wiring, and said input impedance of said second circuit are equal to each other in a bandwidth range that a data signal covers.

3. The semiconductor integrated circuit according to claim 2, wherein
said third circuit includes a data reading circuit and a data holding circuit, and
said feedback circuit includes an emitter follower circuit.

4. The semiconductor integrated circuit according to claim 2, wherein said first circuit includes a flip-flop circuit composed of two latch circuits of a master circuit and a slave circuit.

5. The semiconductor integrated circuit according to claim 2, wherein
said first circuit comprises a transimpedance amplifier,
of said third circuit includes an amplifier, and
said feedback circuit includes an emitter follower circuit.

* * * * *